(12) United States Patent
Liao et al.

(10) Patent No.: US 10,729,002 B2
(45) Date of Patent: Jul. 28, 2020

(54) DEVICE, SYSTEM AND METHOD TO MITIGATE SIGNAL NOISE IN COMMUNICATIONS WITH A MEMORY MODULE

(71) Applicant: Intel Corporation, Santa Clara, CA (US)

(72) Inventors: Jun Liao, Portland, OR (US); Xiang Li, Portland, OR (US); Yunhui Chu, Hillsboro, OR (US); Jong-Ru Guo, Portland, OR (US); James McCall, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/516,174

(22) Filed: Jul. 18, 2019

(65) Prior Publication Data
US 2019/0342990 A1    Nov. 7, 2019

(51) Int. Cl.
| | |
|---|---|
| *H05K 1/02* | (2006.01) |
| *H05K 1/11* | (2006.01) |
| *H03F 3/16* | (2006.01) |
| *H03F 3/68* | (2006.01) |
| *H05K 1/18* | (2006.01) |
| *H03F 3/45* | (2006.01) |

(Continued)

(52) U.S. Cl.
CPC .......... *H05K 1/0216* (2013.01); *G09G 5/006* (2013.01); *H03F 3/16* (2013.01); *H03F 3/45071* (2013.01); *H03F 3/68* (2013.01); *H05K 1/111* (2013.01); *H05K 1/141* (2013.01); *H05K 1/181* (2013.01); *H03F 2200/129* (2013.01); *H03F 2200/72* (2013.01); *H03F 2203/45116* (2013.01); *H05K 2201/10128* (2013.01); *H05K 2201/10159* (2013.01); *H05K 2201/10734* (2013.01)

(58) Field of Classification Search
None
See application file for complete search history.

(56) References Cited

U.S. PATENT DOCUMENTS 5,729,154 A * 3/1998 Taguchi ........... H03K 19/00384
326/30
6,922,071 B2 * 7/2005 Dabral ............... H03K 19/1732
326/26

(Continued)

Primary Examiner — Minh D A
Assistant Examiner — James H Cho
(74) Attorney, Agent, or Firm — Green, Howard & Mughal LLP

(57) ABSTRACT

Techniques and mechanisms for mitigating signal deterioration in communications between two circuit boards. In an embodiment, a packaged device accommodates coupling to a first circuit board which, in turn, accommodates connection to a second circuit board. In one such embodiment, an amplifier circuit of the packaged device includes an amplifier circuit which comprises a variable resistor and an active circuit element coupled thereto. The device receives via one of the circuit boards a control signal and a voltage which configure the amplifier circuit to provide an impedance matching for communication between the circuit boards. In another embodiment, the device comprises multiple common gate amplifiers which are variously configurable each to provide a respective impedance matching for communications between a motherboard and a dual in-line memory module.

20 Claims, 9 Drawing Sheets

(51) Int. Cl.
*G09G 5/00* (2006.01)
*H05K 1/14* (2006.01)

(56) References Cited

U.S. PATENT DOCUMENTS 8,638,838 B1 * 1/2014 Betts .................... H04L 5/16
326/30
9,106,222 B2 * 8/2015 Kao .................... H04L 25/0278

* cited by examiner

DEVICE, SYSTEM AND METHOD TO MITIGATE SIGNAL NOISE IN COMMUNICATIONS WITH A MEMORY MODULE

BACKGROUND

1. Technical Field

This disclosure generally relates to expansion cards and more particularly, but not exclusively, to devices which mitigate signal noise in a memory system.

2. Background Art

In many computer platforms, motherboards are typically produced and sold without memory attached. Instead, computer memory is added when a computer system is configured or built for later sale. Often, computer memory is connected to a motherboard by inserting a memory module, such as a Dual In-Line Memory Module (DIMM) into a receiver known as a DIMM connector or DIMM slot.

In a typical memory system, a printed circuit board (PCB) comprises a plurality of slots which each accommodate connection to a respective DIMM. Double Data Rate (DDR) memory channels in motherboards may have as few as one DIMM connector, but typically have 2, 3, or 4 DIMM connectors. Additionally, there may be multiple DDR channels on a single motherboard, each having multiple DIMM connectors. Generally, each such DIMM runs at a relatively high number of data transfers per second when the slots are fully populated.

Computer manufacturers or consumers oftentimes populate only a single DIMM connector in a given memory channel with memory, at least initially, leaving one or more slots available for later memory expansion. When empty DIMM connectors are present on a motherboard, or other type of board, performance suffers. In such cases, interconnect structures at (and/or extending to) an empty slot promote undesirable signal reflection, which usually require one or more DIMMs to run at a significantly reduced number of data transfers per second.

As successive generations of memory system technologies continue to impose more stringent data rate and channel bandwidth requirements, there is expected to be an increasing premium placed on incremental improvements to protect data signal integrity.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
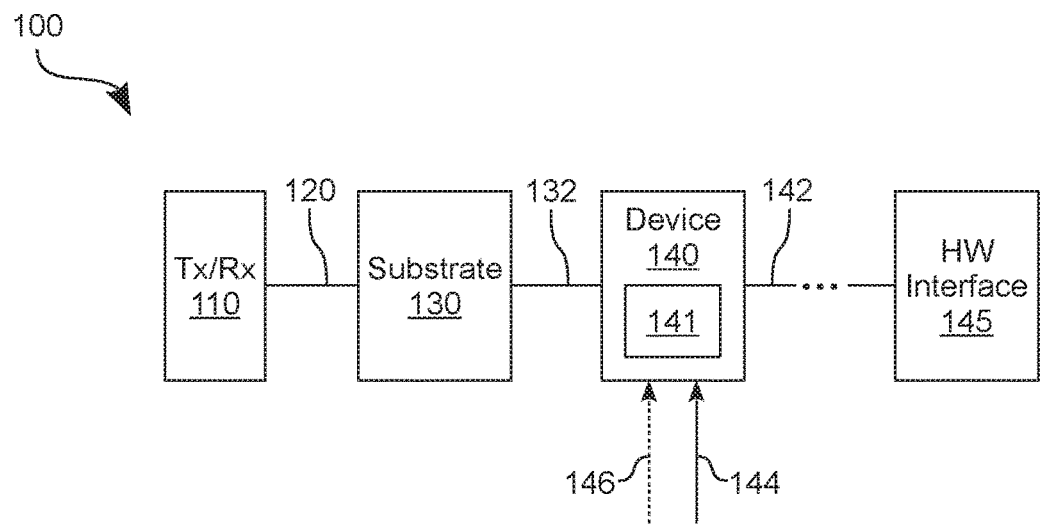
FIGS. 1A and 1B are functional block diagrams each illustrating elements of a respective system to provide impedance matching according to a corresponding embodiment.

Embodiments discussed herein variously provide techniques and mechanisms for mitigating signal deterioration in communications between two circuit boards. In some embodiments, a packaged device accommodates coupling to a first circuit board which, in turn, accommodates connection to a second circuit board. In one such embodiment, integrated circuitry of the packaged device includes an amplifier circuit which comprises a variable resistor and an active circuit element (e.g., a transistor) coupled thereto. The device receives, via one of the first circuit board or the second circuit board, a control signal (which determines an impedance of the variable resistor) and a voltage—e.g., a supply voltage or a bias voltage. Based on said control signal and voltage, the amplifier circuit is configured to provide an impedance matching for communication between the circuit boards.

The first circuit board and the second circuit board include a motherboard and a DIMM (or other memory module), for example. In various embodiments, the amplifier circuit includes a common gate amplifier—e.g., wherein biasing a gate terminal of the amplifier helps shield an output node of the amplifier from an input node of the amplifier. Adjusting the variable resistor of such an amplifier circuit helps mitigate impedance mismatch between the amplifier circuit and a channel to which the amplifier circuit is coupled.

In providing an active impedance matching device which is distinct from (but couples to) a circuit board, some embodiments variously enable an easily-adaptable solution to reduce signal reflections—e.g., while mitigating the need for a memory module to include a centralized data buffer, such as that of a Fully Buffered DIMM. For example, some embodiments provide an active impedance matching circuit which is very space efficient (e.g., less than 0.5 mm) and/or very simple (e.g., including only one transistor and only one tunable resistor). Such small form factor embodiments accommodate use at any of various locations, depending on system requirement. For example, an impedance matching device of some embodiments accommodates coupling at a motherboard, a memory module (e.g., a DIMM), or a connector which accommodates reception of a memory module. Various embodiments require relatively minor (if any) changes to circuit board trace routing and/or to connector interface layout. Furthermore, some embodiments (unlike various passive termination solutions) facilitate a relatively high percent of signal energy to be passed through the channel.

Certain features of various embodiments are described herein with reference to impedance matching for communications between a motherboard and a DIMM. However, such description may be extended to additionally or alternatively apply to impedance matching for communications with any of various other types of memory modules or other such expansion cards. In some embodiments, such communications are compatible with any of various JEDEC (or other) Double Data Rate memory specifications—e.g., including the Double Data Rate Type Four (DDR4) Synchronous Dynamic Random-Access Memory (SDRAM) specification JESD79-4B, published June 2017 by the JEDEC Solid State Technology Association of Arlington, Va., the Double Data Rate Type Three (DDR3) Synchronous Dynamic Random-Access Memory (SDRAM) specification JESD79-3F, published July 2012 by the JEDEC Solid State Technology Association of Arlington, Va., or the like.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a circuit board and circuitry, coupled thereto, which is operable to participate in communications with another circuit board.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/− 10% of a target value. For example, unless otherwise specified in the explicit context of their use, the terms "substantially equal," "about equal" and "approximately equal" mean that there is no more than incidental variation between among things so described. In the art, such variation is typically no more than +/− 10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

It is pointed out that those elements of the figures having the same reference numbers (or names) as the elements of any other figure can operate or function in any manner similar to that described, but are not limited to such.

FIG. 1A shows features of a system 100 to provide impedance matching according to an embodiment. System 100 is one example of an embodiment wherein a device is coupled between a signal trace of a circuit board and a hardware interface with which a connector (e.g., a DIMM connector) is to couple to the circuit board. The device comprises circuitry to facilitate impedance matching for communication via the signal trace and the hardware interface.

System 100 includes (for example) some or all of a desktop computer, a blade server and/or other such platform. In some embodiments, system 100 includes a DIMM (or other such expansion card) which—for example—supports coupling to, and operation with, a motherboard. As shown in FIG. 1A, system 100 comprises transmitter and/or receiver circuitry Tx/Rx 110, a hardware (HW) interface 145 and a substrate 130 coupled therebetween. Tx/Rx 110 is coupled to substrate 130 via interconnect structures (including the illustrative interconnect 120 shown) which, for example, comprise a pin, pad, ball or other such conductive contact such as that of a socket, a ball grid array, a pinfield, or the like. In some embodiments, HW interface 145 comprises one or more conductive contacts disposed at a side of substrate 130—e.g., where such one or more conductive contacts are each coupled to a respective contact of a DIMM connector which is disposed on substrate 130. In other embodiments, a DIMM connector comprises HW interface 145—e.g., wherein the DIMM connector is soldered or otherwise coupled, directly or indirectly, to substrate 130.

Tx/Rx 110 provides functionality to variously communicate one or more signals to and/or from HW interface 145 via substrate 130—e.g., where the one or more signals comprise a data signal, an address signal, a control signal, a clock signal, and/or the like. In an embodiment, system 100 includes (or alternatively, is to couple to) one or more memory modules, wherein communication between Tx/Rx 110 and HW interface 145 facilitates access of the one or more memory modules.

By way of illustration and not limitation, substrate 130, in some embodiments, is that of a motherboard on which is mounted (or otherwise disposed) one or more packaged devices which include, in addition to Tx/Rx 110, memory controller circuitry, processor circuitry and/or other host logic. For example, such one or more packaged devices comprise integrated circuit resources such as (but not limited to) a memory controller, a central processing unit, a graphics processor, a cache memory, a controller hub, one or more busses and/or the like. In one such embodiment, Tx/Rx 110 supports operation of a memory controller to access memory resources on behalf of an operating system or other software process—e.g., where a system-on-chip (SoC) comprises Tx/Rx 110. In alternative embodiments, substrate 130 is a circuit board of a memory module (such as a DIMM)—e.g., wherein a packaged device comprising Tx/Rx 110 further includes a DRAM array. In one such embodiment, the memory module provides functionality which is compatible with a Double Data Rate (DDR) memory specification such as one released by the JEDEC Solid State Technology Association.

In an illustrative scenario according to one embodiment, substrate 130 comprises a conductive signal trace (not shown) which is coupled to interconnect 120—e.g., wherein a bus of substrate 130 includes the signal trace. To facilitate communications which use such a signal trace, system 100 further comprises a device 140 which is coupled between HW interface 145 and substrate 130. Device 140 comprises circuitry which is configurable (e.g., reconfigurable) to provide different impedance matching at different times. Such impedance matching is determined, for example, based at least in part on control signaling which is received at device 140 via substrate 130 and/or via HW interface 145.

By way of illustration and not limitation, device 140 provides functionality to communicate a data signal 132 with substrate 130, and further to communicate another data signal 142 with HW interface 145, wherein one of data signals 132, 142 is based on the other of data signals 132, 142. In one such embodiment, device 140 further provides functionality to receive a voltage 144 and a control signal 146 (e.g., each via a respective one substrate 130 or HW interface 145).

Device 140 comprises an amplifier circuit 141 (e.g., a common gate amplifier) which is operable to provide impedance matching based on voltage 144 and control signal 146. For example, amplifier circuit 141 comprises a variable resistor which is operable to provide a resistance which is determined based on control signal 146. In one such embodiment, amplifier circuit 141 further comprises an active circuit element (e.g., a transistor) which is coupled to the variable resistor, where the active circuit element is configured to conduct a current based on voltage 144 and said resistance. Based on such a current, amplifier circuit 141 outputs an impedance matched version of a data signal which is received at device 140.

In an illustrative scenario according to one embodiment, device 140 receives data signal 142 from HW interface 145, wherein data signal 132 (which device 140 communicates to substrate 130) is an impedance matched version of data signal 142 that is based on voltage 144 and control signal 146. Alternatively, device 140 receives data signal 132 from substrate 130, wherein data signal 142 (which device 140 instead communicates to HW interface 145) is an impedance matched version of data signal 132 that is based on voltage 144 and control signal 146

In some embodiments, device 140 is physically located between substrate 130 and a connector which includes (or alternatively, is to couple to) HW interface 145. In other embodiments—e.g., where substrate 130 includes HW interface 145—data signal 142 is communicated between device 140 and HW interface 145 via another signal trace of substrate 130.

In some embodiments, device 140 further comprises one or more other amplifier circuits (not shown) which are each coupled between a different respective signal trace of substrate 130, and a different respective conductive contact of HW interface 145. Some or all such one or more other amplifier circuits variously provide respective impedance matching functionality such as that of amplifier circuit 141.

Figure 1B:
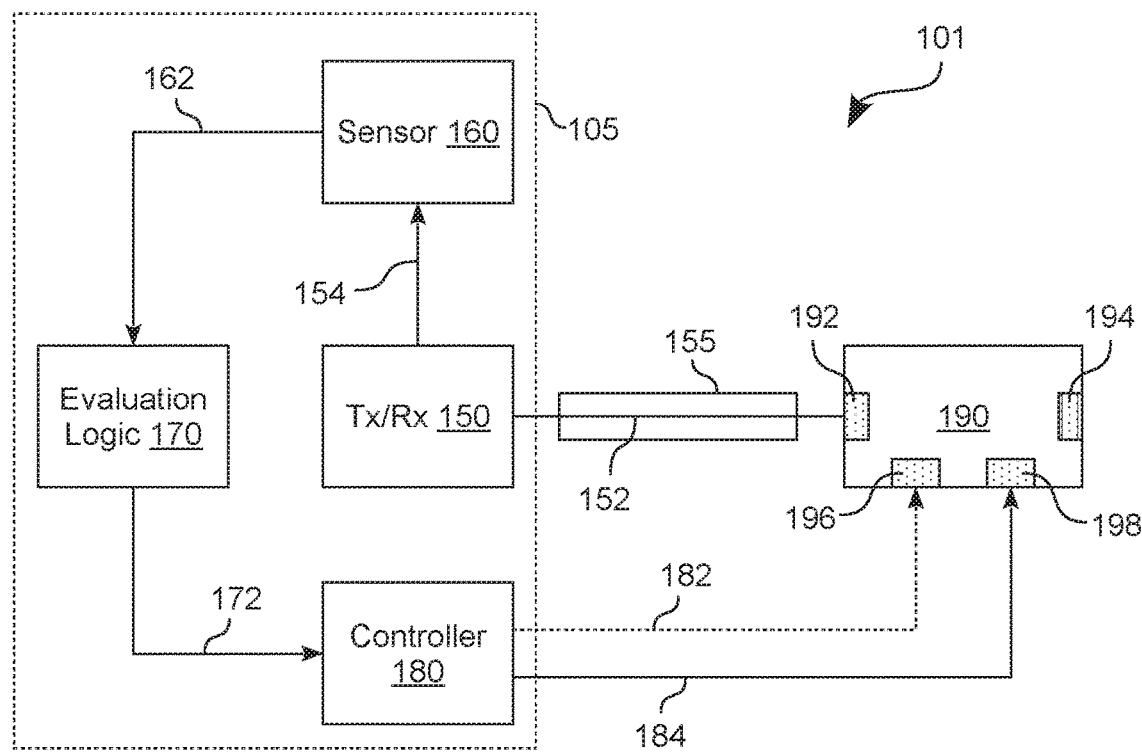

FIG. 1B shows features of a system 101 to provide impedance matching according to an embodiment. System 101 includes features of system 100, for example—e.g., wherein a transmitter and/or receiver circuit Tx/Rx 150, a circuit board 155, and a device 190 of system 101 correspond functionally to Tx/Rx 110, substrate 130, and device 140 (respectively). As shown in FIG. 1B, circuit board 155 is coupled between device 190 and host circuitry 105 of system 101—e.g., where host circuitry 105 comprises Tx/Rx 150, a sensor 160, evaluation logic 170, and a controller 180. Although devices 140, 190 are variously shown in relation to other components of systems 100, 101 (respectively), some embodiments are provided only by device 140 or only by device 190, for example.

In the example embodiment shown, Tx/Rx 150 is coupled to a conductive contact 192 of device 190 via a signal trace 152 of circuit board 155. Sensor 160 is coupled to snoop or otherwise detect a signal 154 which includes, or is otherwise based on, a communication via signal trace 152 (e.g., where signal 154 is based on communication of data signal 132). Sensor 160 communicates to evaluation logic 170 a signal 160 which indicates a characteristic of such communication—e.g., where signal 160 specifies a metric value for a signal delay or other such timing characteristic.

Based on signal 162, evaluation logic 170 performs an evaluation to determine, for example, whether a metric value for the characteristic is within some predefined range. By way of illustration and not limitation, evaluation logic 170 is programmed or otherwise configured to include, have access to, or otherwise operate based on one or more test criteria which each correspond to a respective operational mode of system 101. A given test criterion specifies or otherwise indicates, for example, a respective range of values for a metric (e.g., a signal timing metric) which varies with a level of impedance mismatch—e.g., where the value range is defined at least in part by a threshold minimum period of time and/or a threshold maximum period of time.

Based on an evaluation of signal 162, evaluation logic 170 communicates to controller 180 a signal 172 which specifies or otherwise indicates an impedance to be provided with device 190. In an illustrative scenario according to one embodiment, signal 172 indicates (based on signal 162 indicating that a metric is in a first range of values) that a corresponding first impedance is to be provided with device 190. In one such embodiment, signal 172 indicates at another time (based on signal 162 instead indicating that the metric is in a second range of values) that a corresponding second impedance is to be provided with device 190. Responsive to signal 172, controller 180 selectively configures device 190 to mitigate an impedance mismatch of a communication path which includes some or all of signal trace 152.

By way of illustration and not limitation, device 190 further comprises conductive contacts 196, 198 which are coupled to receive a control signal 182 and a voltage 184 (respectively) from host circuitry 105—e.g., where one or both of control signal 182 and voltage 184 are communicated via respective conductors of circuit board 155. In one such embodiment, device 190 comprises an amplifier circuit (such as amplifier circuit 141), wherein configuring device 190 to mitigate an impedance mismatch comprises controller 180 adjusting control signal 182 and/or voltage 184.

For example, the amplifier circuit is configured to variously communicate a first signal and a second signal—e.g., data signals 132, 142—with conductive contacts 192, 194 (respectively) of device 190. The amplifier circuit comprises a variable resistor and an active circuit element, wherein the variable resistor provides a resistance based on control signal 182, and wherein the active circuit element conducts a current which is based on both the resistance and voltage 184. In one such embodiment, the first signal or the second signal is output by the amplifier circuit based on the current and the other of the first signal or second signal.

Figure 2A:
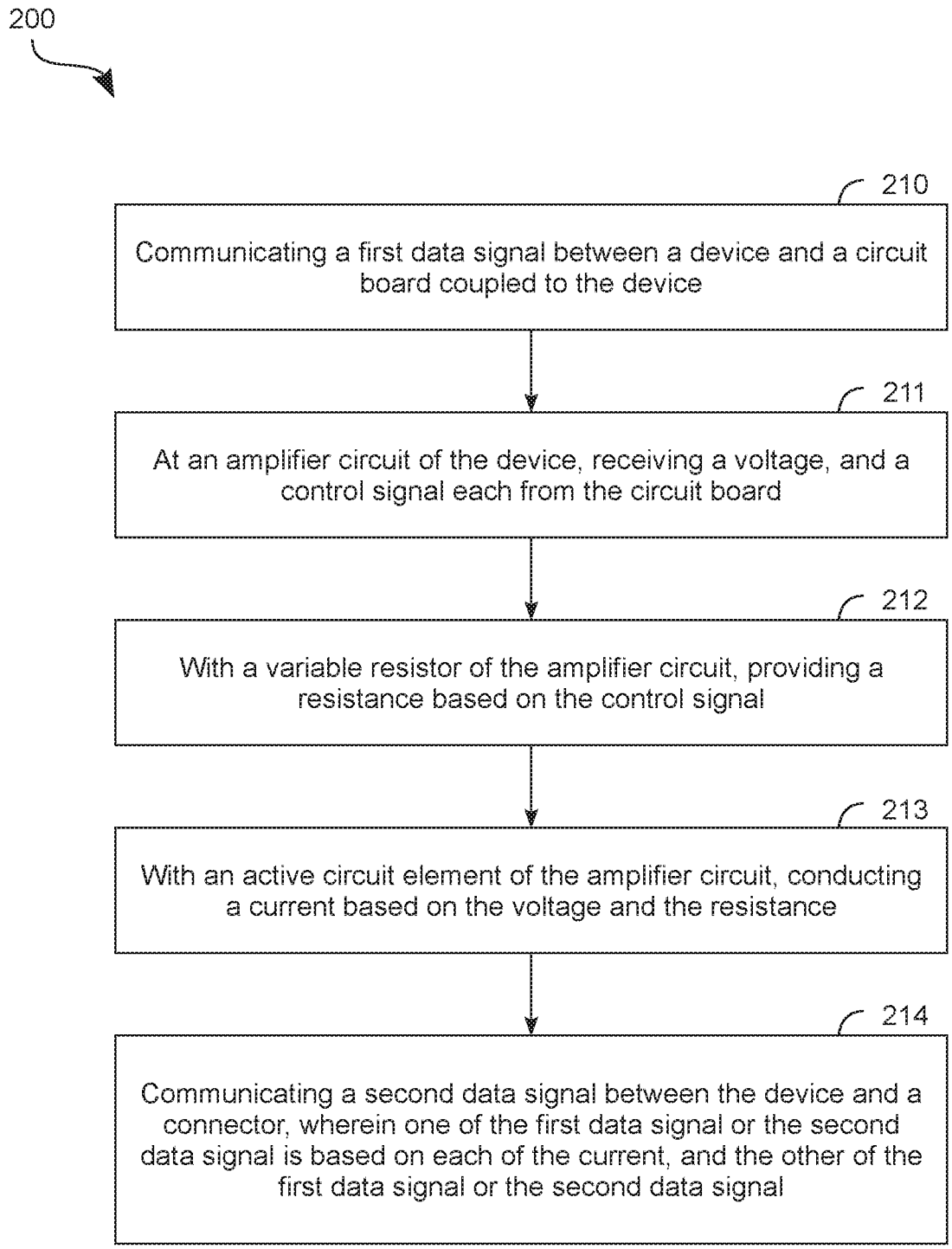
FIGS. 2A and 2B are flow diagrams each illustrating elements of a respective method to mitigate an impedance mismatch according to a corresponding embodiment.

FIG. 2A shows features of a method 200 to mitigate an impedance mismatch according to an embodiment. Method 200 is one example of an embodiment wherein an amplifier circuit, coupled between a hardware interface and a signal trace of a circuit board, is operated to mitigate degradation of a signal which is communicated with a memory module. Method 200 is performed with circuit structures of one of systems 100, 101, for example.

As shown in FIG. 2A, method 200 comprises (at 210) communicating a first data signal between a device and a circuit board which is coupled to said device. In an embodiment, the device provides functionality of one of devices 140, 190, wherein the circuit board is a motherboard or that of a memory module (such as a DIMM). For example, the communicating at 210 comprises device 140 receiving one of data signals 132, 142.

Method 200 further comprises (at 211) receiving, at an amplifier circuit of the device, a voltage and a control signal which, for example, are each from the circuit board. The receiving at 211 includes, for example, circuit 141 receiving voltage 144 and control signal 146—e.g., wherein the amplifier circuit includes a common gate amplifier. Method 200 further comprises (at 212) providing a resistance with a variable resistor of the amplifier circuit, wherein said providing is based on the control signal. Method 200 further comprises (at 213) conducting a current with an active circuit element of the amplifier circuit, wherein the current is based on the voltage and the resistance which is provided at 212.

Method 200 further comprises (at 214) communicating a second data signal between the device and a connector, wherein one of the first data signal or the second data signal is based on each of the current, and the other of the first data signal or the second data signal. In an example embodiment, the communicating at 214 comprises device 140 transmitting the other of data signals 132, 142 from device 140. The first data signal and the second data signal are each compatible (for example) with a DDR memory specification such as one released by the JEDEC Solid State Technology Association. In various embodiments, the control signal and the first data signal are received at the device each from a second device which is mounted on the circuit board—e.g., where the second device comprises a system-on-chip. In one such embodiment, the device transmits the second data signal at 214 to a receiver circuit of a third device which is coupled to the circuit board via a connector. Such a third device comprises a memory module, for example.

In some embodiments, the device further comprises one or more other amplifier circuits which are variously operable each perform a respective version of method 200 for a respective first data signal and a respective second data signal. In one such embodiment, the one or more other amplifier circuits each perform a respective version of method 200 based on the same control signal and the same voltage which are received at 211. In another embodiment, two or more such amplifier circuits each perform a respective version of method 200 based on different respective control signals and/or different respective voltages communicated via the circuit board.

Figure 2B:
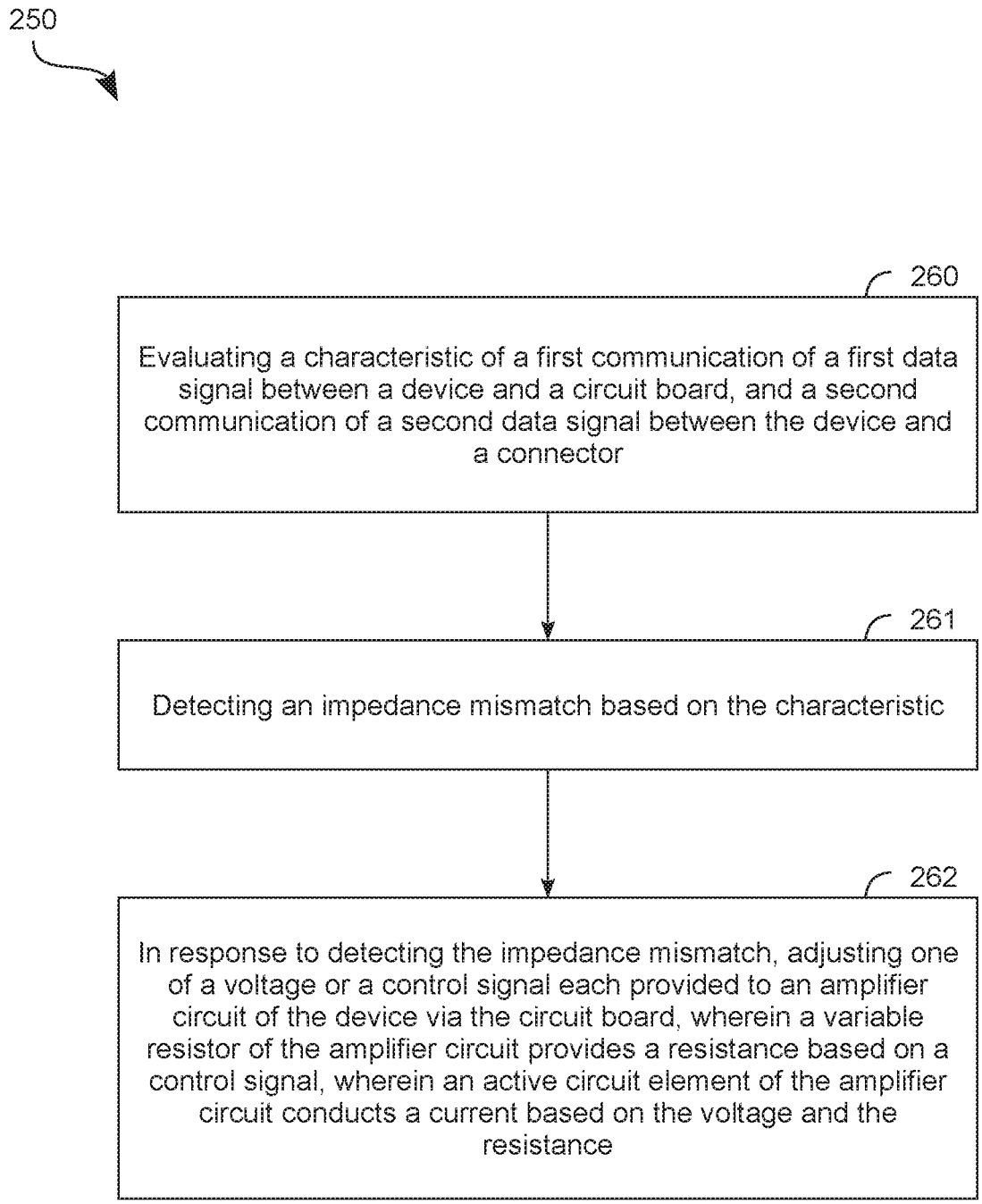

FIG. 2B shows features of a method 250 to mitigate an impedance mismatch according to an embodiment. Method 250 is one example of an embodiment wherein circuit logic determines, based on a detected impedance mismatch, a configuration of an amplifier circuit such as that which is operated by method 200 (for example). Method 250 is performed with one of systems 100, 101, in some embodiments.

As shown in FIG. 2B, method 250 comprises (at 260) evaluating a characteristic of data communications which comprise a first communication of a first data signal between a device and a circuit board, and a second communication of a second data signal between the device and a connector. Method 250 further comprises (at 261) detecting an impedance mismatch based on the characteristic which is evaluated at 260. In an illustrative embodiment, the evaluating at 260 and the detecting at 216 comprises evaluation logic 170 determining, based on signal 162, that a metric value for a signal timing (or other such communication characteristic) is within—or alternatively, outside of—a predefined range. For example, the detecting at 261 comprises determining that a data eye, for communications between a motherboard and a memory module, fails to satisfy one or more test criteria. In an embodiment, this determining includes, or is otherwise based on, one or more operations which (for example) are adapted from conventional techniques for evaluating a data eye or other such signal communication characteristic. Some embodiments are not limited to a particular test criteria for evaluating a communication characteristic at 260.

Method 250 further comprises (at 262) adjusting one of a voltage or a control signal which are each provided to an amplifier circuit of the device via the circuit board, where the adjusting is in response to detecting at 261. In some embodiments, the amplifier circuit (e.g., amplifier circuit 141) comprises a variable resistor and an active circuit element, wherein the variable resistor provides a resistance based on a control signal, and wherein the active circuit element conducts a current which is based on the voltage and the resistance. In one such embodiment, one of the first data signal or the second data signal is generated based on each of the current, and the other of the first data signal or the second data signal.

Figure 3:
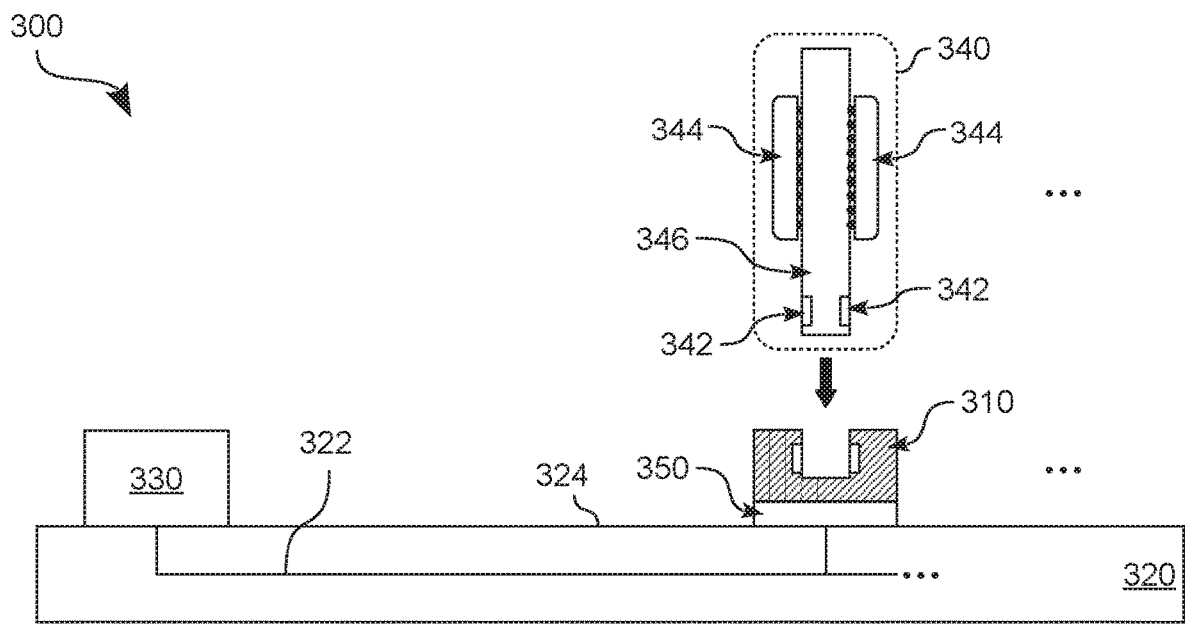
FIG. 3 is a cross-sectional side view diagram illustrating elements of a system to mitigate signal noise according to an embodiment.
Figure 3:
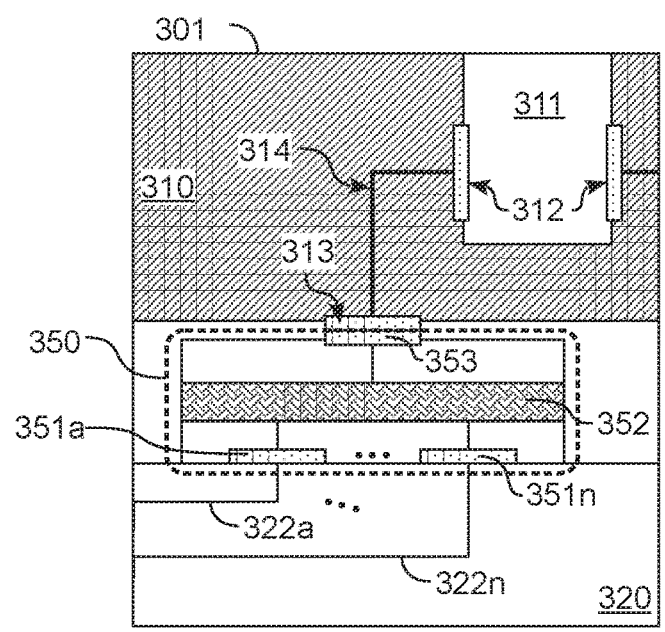

FIG. 3 shows features of a system 300 to mitigate signal noise according to an embodiment. System 300 is one example of an embodiment wherein a device, which provides an impedance matching functionality, is coupled at a motherboard which supports connection to one or more DIMMs. Operation of such a device includes or is otherwise based on performance of one of methods 200, 250, for example.

As shown in FIG. 3, system 300 comprises a motherboard 320 to facilitate memory access functionality. A cross-sectional side view 301 in FIG. 3 illustrates an example of various structures of device 350 in one embodiment. One or more packaged devices (including the illustrative packaged device 330 shown) are further coupled to a motherboard 320—e.g., wherein packaged device 330 provides some or all of the functionality of host circuitry 105. Motherboard 320 is a multi-layer circuit board having multiple electrical conduction layers running through it. In an example embodiment, packaged device 330 sits in an electrical socket (not shown) and is connected to motherboard 320 through motherboard vias. Motherboard 320 connects packaged device 330 to a bus 322 that includes electrical interconnects within motherboard 320. Bus 322 is also attached, through a motherboard pinfield (not shown) to a connector 310 of system 300. In some embodiments, motherboard 320 further comprises one or more other pinfields (not shown) which each provide connection between bus 322 and a respective DIMM connector.

Bus 322 comprises interconnects to variously provide one or more voltages and/or to communicate signals including (for example) clock and control signals, address signals, command signals, and data signals. Data signals carry the actual data that will be stored in, or retrieved from, a memory module that is to couple to motherboard 320. Address signals specify memory locations where data is to be read from or written to, and may also select which of several memory devices is to be accessed. Command signals instruct a memory device as to what type of operation is to be performed, e.g., read, write, refresh, and possibly as to which of several access modes (such as a burst mode) should be used for a data transfer. Clock and control signals synchronize the other signals passing between the memory controller and packaged devices 344. Although bus 322, in some embodiments, uses a separate signal line for each memory signal (e.g., 32 address lines to transfer a 32-bit-wide address in one clock cycle and 32 data lines to transfer a 32-bit-wide data word in one clock cycle), any of various other schemes alternatively re-use one or more signal lines for different memory signals during different clock cycles of a memory transaction.

Memory is added to system 300 by inserting a memory module into a connector that is disposed on motherboard 320. One example type of memory module is a DIMM. In the example illustrated in FIG. 3, connector 310 facilitates connection of a DIMM 340 to a surface 324 of motherboard 320. In practical operation, connector 310 is soldered or otherwise coupled to motherboard 320. Subsequently, a user plugs DIMM 340 into connector 310 to complete the electrical connections between DIMM 340 and packaged device 330 via connector 310, bus 322 and a device 350 coupled therebetween.

A DIMM generally has multiple individual memory devices mounted to it—e.g., where packaged memory devices are variously soldered or otherwise coupled to a circuit board of the DIMM. For example, DIMM 340 comprises a circuit board 346 and packaged devices 344 variously coupled thereto. Circuit board 346 has conductive contacts 342 variously arranged thereon, the conductive contacts 342 to facilitate electrical connections to bus 322 when DIMM 340 is inserted into connector 310. In an illustrative embodiment, packaged devices 344 comprise respective DRAMs to store various data each in a respective array of addressable memory cells. A memory controller (e.g., at packaged device 330) controls the exchange of data between a host and packaged devices 344. Although some embodiments are not limited in this regard, packaged memory devices 344 variously work in parallel with each other to perform respective memory functions. In an example scenario for one embodiment, DIMM 340 comprises eight memory devices, each of which receives the same memory address from a memory controller. If the size of a data word is 32 bits, each of the memory devices is responsible for four bits of the data word that is placed on memory bus 322.

In the example embodiment which is illustrated by view 301, connector 310 forms a recess structure 311 which accommodates insertion of circuit board 346 therein. For example, conductive contacts 312 of connector 310 are variously located each at a respective sidewall of recess structure 311, wherein insertion of circuit board 346 into recess structure 311 connects conductive contacts 312 each with a corresponding one of conductive contacts 342. Conductive contacts 312 facilitate coupling between DIMM 340 and motherboard 320. By way of illustration and not limitation, connector 310 comprises a conductive contact 313 and an interconnect 314 which is coupled between conductive contact 313 and a corresponding one of conductive contacts 312. In one such embodiment, a hardware interface of connector 310 comprises conductive contacts 312—which enable connection between DIMM 340 and connector 310—and/or contacts (e.g., including conductive contact 313) which enable connection between motherboard 320 and connector 310.

To facilitate impedance matching, system 300 further comprises a device 350 which, (for example), is coupled between a signal trace of bus 322 and a hardware interface of connector 310 or—alternatively—a hardware interface of substrate 320. In an embodiment, device 350 provides functionality of one of devices 140, 190—e.g., wherein conductive contacts 351a, . . . , 351n of device 350 correspond functionally to contacts 192, 196, 198, and/or where another conductive contact 353 of device 350 corresponds functionally to contact 194.

In the example embodiment shown, conductive contacts 351a, . . . , 351n are variously coupled to respective signal traces 322a, . . . , 322n of bus 322. Contacts 351a, . . . , 351n facilitate communication of first signal (such as data signal 132) and one or more voltages and/or one or more control signals to determine an impedance matching in aid of communications which use said first signal. Contact 353 is coupled to communicate a second signal (such as data signal 142) with connector 310. In one such embodiment, a circuit layer 352 of device 350 comprises an amplifier circuit which is variously coupled to contacts 351a, . . . , 351n and to contact 353. The amplifier circuit comprises a variable resistor and an active circuit element, which are variously operated based on a voltage and a variable resistance control signal which are received via conductive contacts 351a, . . . , 351n. Such operation results in device 350 outputting one of the first signal or the second signal as an impedance matched version of the other of the first signal or the second signal.

In the example, embodiment shown, conductive contact 353 is on a side of device 350 which is opposite another side of device 350 on which is disposed conductive contacts 351a, . . . , 351n. In an alternative embodiment, contacts variously providing functionality of conductive contacts 351a, . . . , 351n and conductive contact 353 are all on a same side of a device—e.g., wherein both of the first signal and the second signal (e.g., both data signals 132, 142) are communicated between the device and a circuit board, and where one such signal is communicated between a memory module connector and the device via the circuit board.

Figure 4A:
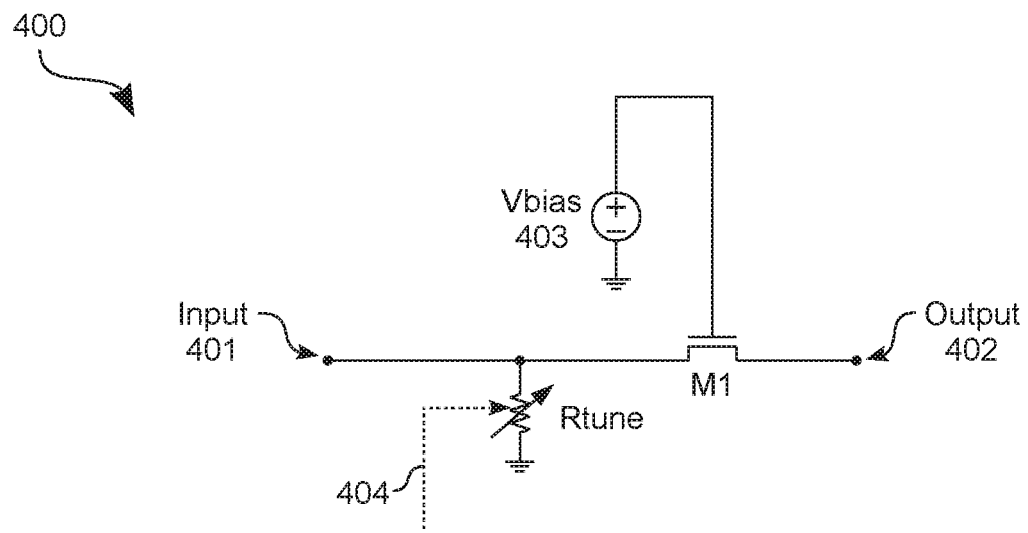
FIGS. 4A and 4B are circuit diagrams each illustrating elements of a respective device to facilitate data communication via a circuit board according to a corresponding embodiment.

FIG. 4A illustrates one example of a circuit 400 to facilitate data communication via a circuit board according to an embodiment. Circuit 400 comprises an amplifier circuit such as that in one of devices 140, 190, 350, for example. In the embodiment shown, circuit 400 comprises a common gate amplifier including a transistor M1 which is coupled between an input node 401 and an output node 402. A variable resistor Rtune of circuit 400, which is coupled between input node 401 and a reference potential (e.g., a ground), is operable to variously provide different levels of resistance at different times, responsive to a control signal 404. A gate terminal of transistor M1 is coupled to a bias voltage Vbias 403, wherein a current conducted between input node 401 and output node 402 via M1 is based on Vbias 403 and the resistance provided with Rtune. With Rtune, an equivalent impedance of circuit 400 is tuned to more closely match that of a channel to which circuit 400 is coupled. Based on the current conducted with M1, circuit 400 communicates an output signal from node 402 as an impedance matched version of a signal which circuit 400 receives at node 401.

In one such embodiment, device 140 includes circuit 400—e.g., wherein Vbias 403 is voltage 144, control signal 404 is control signal 146, and wherein nodes 401, 402 are each to communicate a respective one of data signals 132, 142. In another embodiment, device 190 includes circuit 400—e.g., wherein nodes 401, 402 are each coupled to a respective one of contacts 192, 194, and wherein control signal 404 and Vbias 403 (control signal 182 and voltage 184, for example) are received via contacts 196, 198, respectively.

Figure 4B:
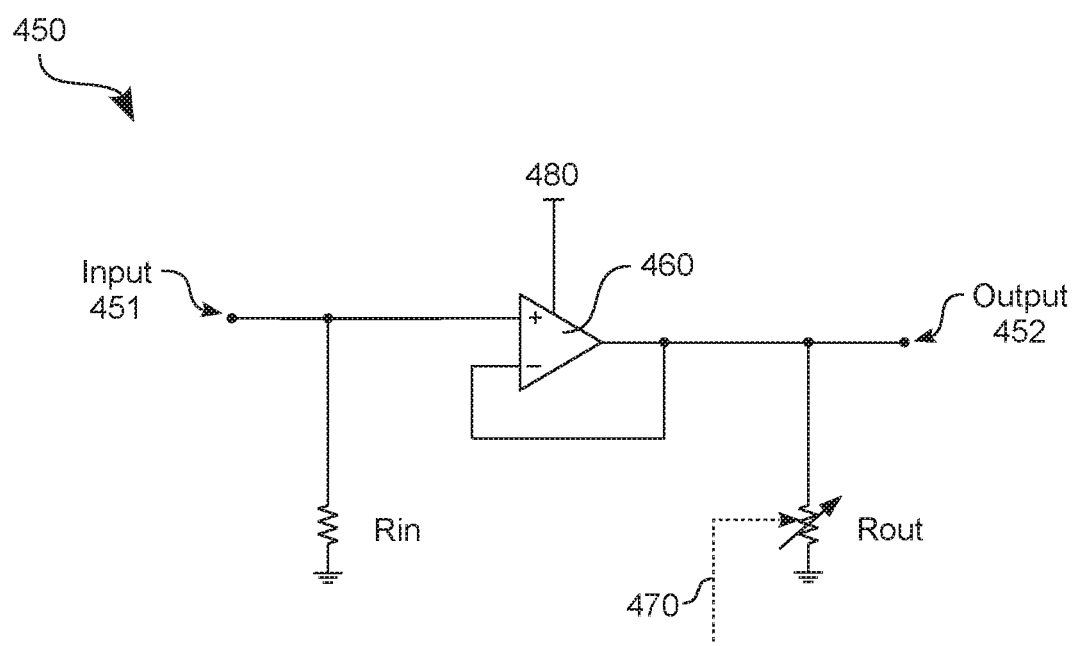

FIG. 4B illustrates a circuit 450 to facilitate data communication via a circuit board according to another embodiment. Circuit 450 comprises an amplifier circuit such as that in one of devices 140, 190, 350, for example. In the embodiment shown, circuit 450 comprises a differential amplifier 460 which is coupled between an input node 451 and an output node 452. A first resistor Rin of circuit 450 is coupled between input node 451 and a reference potential (e.g., a ground), and a second resistor Rout of circuit 450 is coupled between output node 452 and the reference potential. In one such embodiment, one or both of resistors Rin, Rout is variable—e.g., wherein, based on a control signal 470, Rout is to provide different levels of resistance at different times. A feedback path is coupled between node 452 and an input terminal of differential amplifier 460.

In one such embodiment, operation of circuit 450 includes differential amplifier 460 providing an output signal at node 452, wherein differential amplifier 460 conducts a current which is based on voltage 480 and a variable resistance provided with Rout (or, in other embodiments, with Rin). Such an output signal from node 452 functions as an impedance matched version of an input signal which circuit 450 receives at node 451.

In an embodiment, device 140 includes circuit 450—e.g., wherein voltage 480 is voltage 144, control signal 470 is control signal 146, and wherein nodes 451, 452 are each to communicate a respective one of data signals 132, 142. In another embodiment, device 190 includes circuit 450—e.g., wherein nodes 451, 452 are each coupled to a respective one of contacts 192, 194, and wherein control signal 470 and voltage 480 (control signal 182 and voltage 184, for example) are received via contacts 196, 198, respectively.

Figure 5:
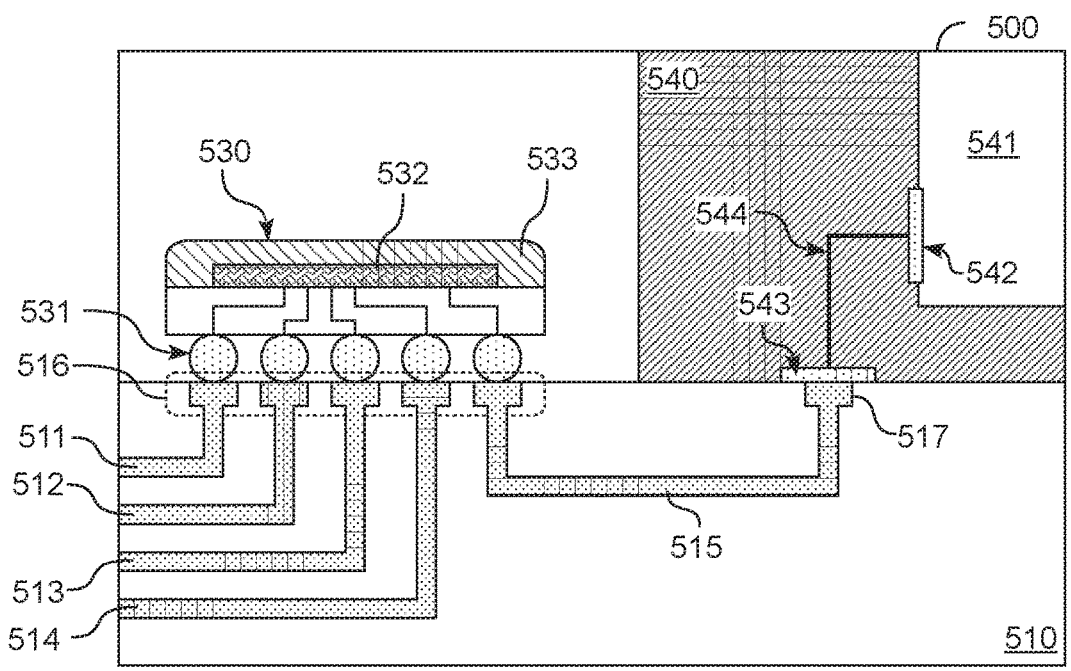
FIG. 5 is a cross-sectional side view diagram illustrating elements of a system to communicate data via a printed circuit board according to an embodiment.

FIG. 5 shows features of a system 500 to communicate data via a printed circuit board according to an embodiment. System 500 includes features of one of systems 100, 101, 300, for example—e.g., wherein method 200 and/or method 250 are performed with system 500.

As shown in FIG. 5, system 500 includes a circuit board 510 and a device 530 coupled thereto. Conductive traces of circuit board 510—e.g., including traces 511-515—variously facilitate electrical connection between circuit board 510, device 530, and a connector (such as the illustrative connector 540 shown). For example, a hardware interface of device 530 comprises conductive contacts 531 which are each on the same side of device 530, wherein contacts 531 are variously soldered or otherwise coupled each to a respective one of conductive traces 511-515. In one such embodiment, conductive traces 511-514 facilitate connection between device 530 and integrated circuitry (not shown) which is further coupled to circuit board 510—e.g., wherein such integrated circuitry provides functionality of Tx/Rx 110, host circuitry 105, or packaged device 330. Conductive trace 515 facilitates connection between device 530 and a conductive contact 517 at a side of circuit board 510.

In the example embodiment shown, connector 540 is soldered or otherwise coupled at a side of circuit board 510, wherein conductive contact 517 is coupled to a hardware interface of connector 540. By way of illustration and not limitation, connector 540 forms a recess structure 541 which accommodates insertion of a memory module (or other expansion card) therein—e.g., wherein connector 540 comprises conductive contacts 542, 543 which are coupled to one another via an interconnect 544. In one such embodiment, circuit board 510, device 530 and connector 540 correspond functionally to motherboard 320, device 350 and connector 310 (respectively)—e.g., wherein conductive contacts 542, 543 and interconnect 544 correspond functionally to conductive contacts 312, 313 and interconnect 314 (respectively).

For example, to enable impedance matching with device 530, circuitry 532 (disposed in a package mold 533 of device 530) comprises an amplifier circuit—such as one of circuits 141, 400, 450—which is coupled to receive, via traces 511-514, a voltage and a control signal (e.g., voltage 144 and control signal 146, respectively), and a ground potential. Traces 511-514 are further coupled to communicate a signal (such as data signal 132) which is generated by, or a basis for, impedance matching with circuitry 532.

In the embodiment shown, connector 540 is disposed on circuit board 510—e.g., wherein substrate 510 is a motherboard of system 500. In an alternative embodiment, system 500 omits connector 540—e.g., wherein system 500 is a DIMM and wherein circuit board 510 and contact 517 correspond to circuit board 346 and one of conductive contacts 342 (respectively).

Figure 6:
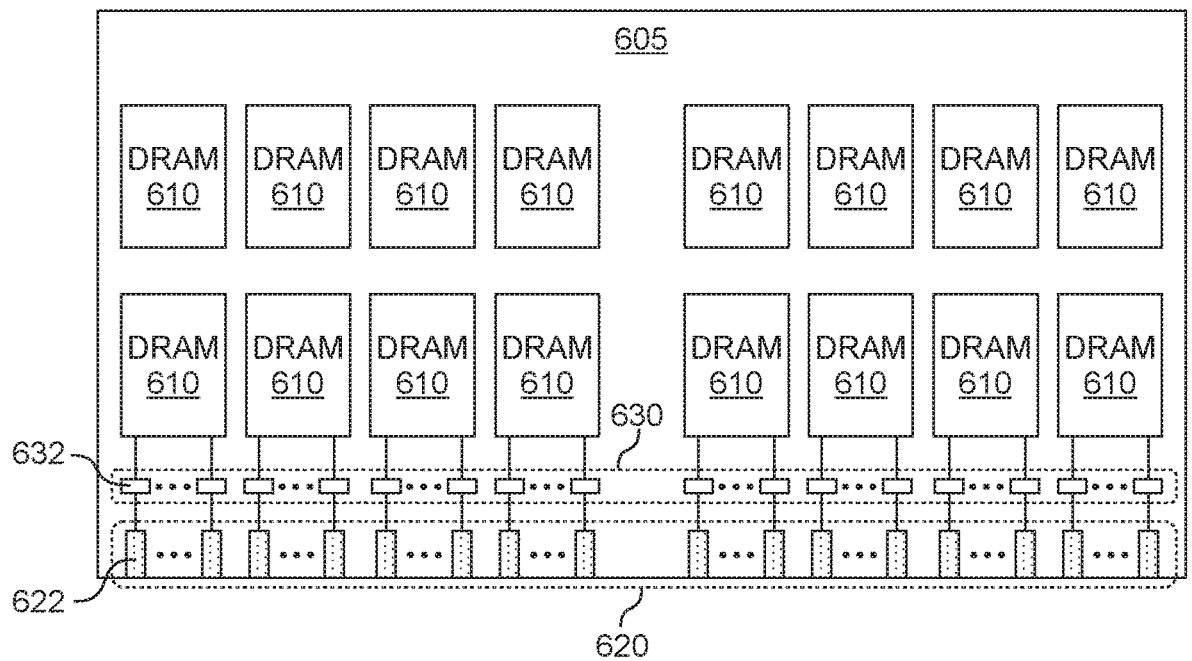
FIG. 6 is a functional block diagram illustrating elements of a dual in-line memory module to communicate data with a hardware connector according to an embodiment.

FIG. 6 shows features of a DIMM 600 to provide impedance matching according to an embodiment. DIMM 600 is one example of an embodiment wherein a memory module includes a circuit board and a device coupled thereto—e.g., wherein the device is configurable to provide impedance matching for communications between the memory module and a motherboard. In some embodiments, DIMM 600 includes features of DIMM 340 or one of systems 100, 101 and/or provides functionality to perform one of methods 200, 250.

As shown in FIG. 6, DIMM 600 includes a circuit board 605 upon which are disposed several packaged DRAM devices 610 (on one or both sides of circuit board 605). A connector edge of circuit board 605 includes a hardware interface 620 by which DIMM 600 is to be coupled to a motherboard (not shown). In one such embodiment, hardware interface 620 comprises contacts 622 for variously communicating data signals, address signals, one or more clock signals, one or more voltages, etc., which facilitate read accesses and/or write accesses to packaged DRAM devices 610.

To facilitate impedance matching, DIMM 600 further comprises one or more devices 630 coupled to circuit board 605, wherein the one or more devices 630 comprise amplifier circuits 632 each coupled between a respective one of contacts 622 and a corresponding one of packaged DRAM devices 610. In various embodiments, some or all of amplifier circuits 632 each correspond functionally to one of circuits 141, 400, 450. For example, in one such embodiment, hardware interface 620 further comprises additional contacts (not shown) with which DIMM 600 receives, from a motherboard coupled thereto, one or more resistance control signals and one or more voltages (e.g., including voltage 144 and control signal 146). Based on such one or more resistance control signals and one or more voltages, some or all of amplifier circuits 632 are variously configured to provide impedance matching for data communications via contacts 622.

Figure 7:
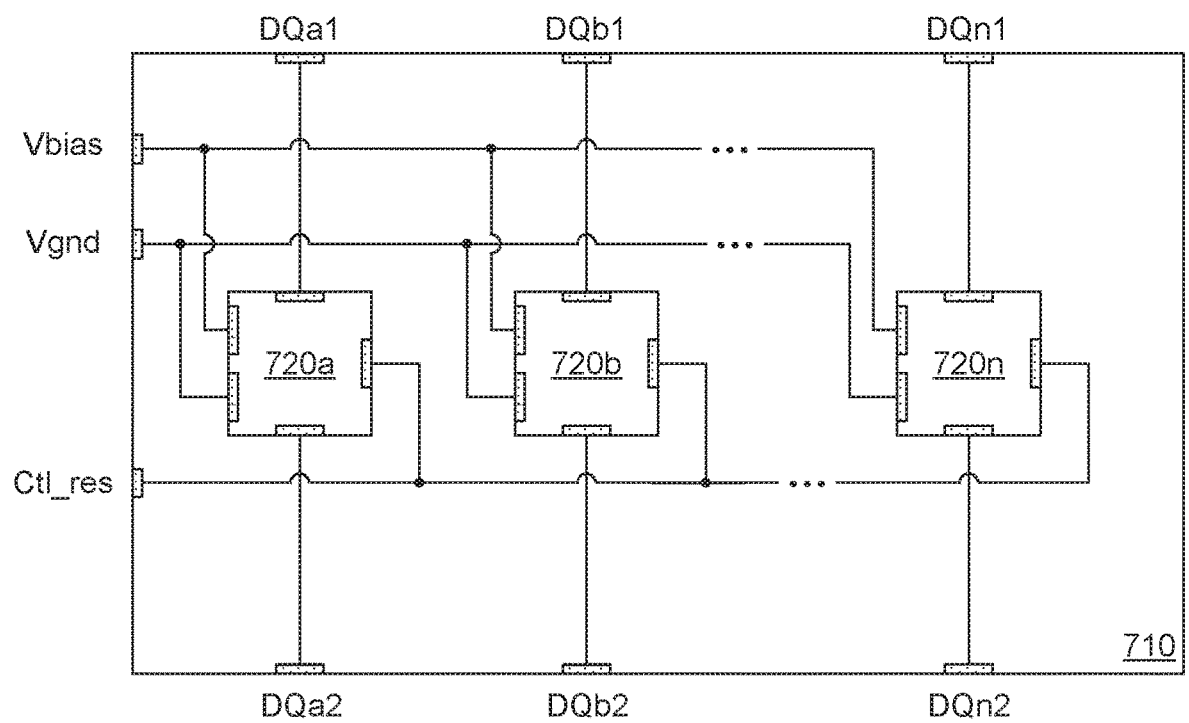
FIG. 7 is a circuit diagram illustrating elements of a device to facilitate communication of data signals with a hardware connector according to an embodiment.

FIG. 7 shows features of a device 700 to provide impedance matching for communications between a motherboard and a memory module according to an embodiment. Device 700 is one example of an embodiment wherein multiple amplifier circuits are provided on a single substrate (e.g., a package substrate) which is configured to support coupling to a circuit board. The amplifier circuits are configurable each to provide a respective impedance matching—e.g., wherein, for each such amplifier circuit, controller 180 (or other suitable control logic) adjusts one or each of a respective voltage or a respective control signal provided to said amplifier circuit. For example, device 700 includes features of one of devices 140, 190, 350, 530—e.g., where device 700 is operable to perform method 200.

As shown in FIG. 7, device 700 comprises conductive contacts DQa1, DQb1, . . . , DQn1 which support coupling of device 700 to a first circuit board—e.g., where other conductive contacts DQa2, DQb2, . . . , DQn2 enable device 700 to be further coupled (directly or indirectly) to a hardware interface. In one such embodiment, the first circuit board is to be connected to a second circuit board via the hardware interface—e.g., wherein the first circuit board, or an expansion card connector, includes the hardware interface. Other conductive contacts of device 700 enable the providing of one or more voltages and/or one or more control signals to configure impedance matching by various amplifier circuits. By way of illustration and not limitation, device 700 is configured to further receive voltages Vbias, Vgnd—e.g., a bias voltage and a ground voltage, respectively—and a control signal Ctl_res from an external resource (such as host circuitry 105).

For a given amplifier circuit of device 700, control signal Ctl_res configures a variable resistance of the amplifier circuit, wherein an active circuit element of the amplifier circuit conducts a current based on both the configured resistance and the voltage Vbias. For example, device 700 comprises amplifier circuits 720a, 720b, . . . , 720n which are variously disposed on a substrate 710 (such as a semiconductor substrate, a silicon interposer, or a package substrate). Amplifier circuits 720a, 720b, . . . , 720n each include a respective variable resistor and a respective active circuit element—e.g., wherein amplifier circuits 720a, 720b, . . . , 720n each provide functionality of one of circuits 141, 400, 450.

In one such embodiment, some or all of amplifier circuits 720a, 720b, . . . , 720n are variously configured based on voltages Vbias, Vgnd and control signal Ctl_res—e.g., where each such amplifier circuit provides a respective impedance matching based on said configuration. For example, amplifier circuit 720a communicates from one of contacts DQa1, DQa2 an impedance matched version of a signal which is received via the other of contacts DQa1, DQa2. Alternatively or in addition, amplifier circuit 720b communicates from one of contacts DQb1, DQb2 an impedance matched version of a signal which is received via the other of contacts DQb1, DQb2—e.g., where amplifier circuit 720n communicates from one of contacts DQn1, DQn2 an impedance matched version of a signal which is received via the other of contacts DQn1, DQn2. In some embodiments, circuity including amplifier circuits 720a, 720b, . . . , 720n is configured to support bi-directional communication (and impedance matching) between one of conductive contacts DQa1, DQb1, . . . , DQn1 and a corresponding one of conductive contacts DQa2, DQb2, . . . , DQn2.

Figure 8:
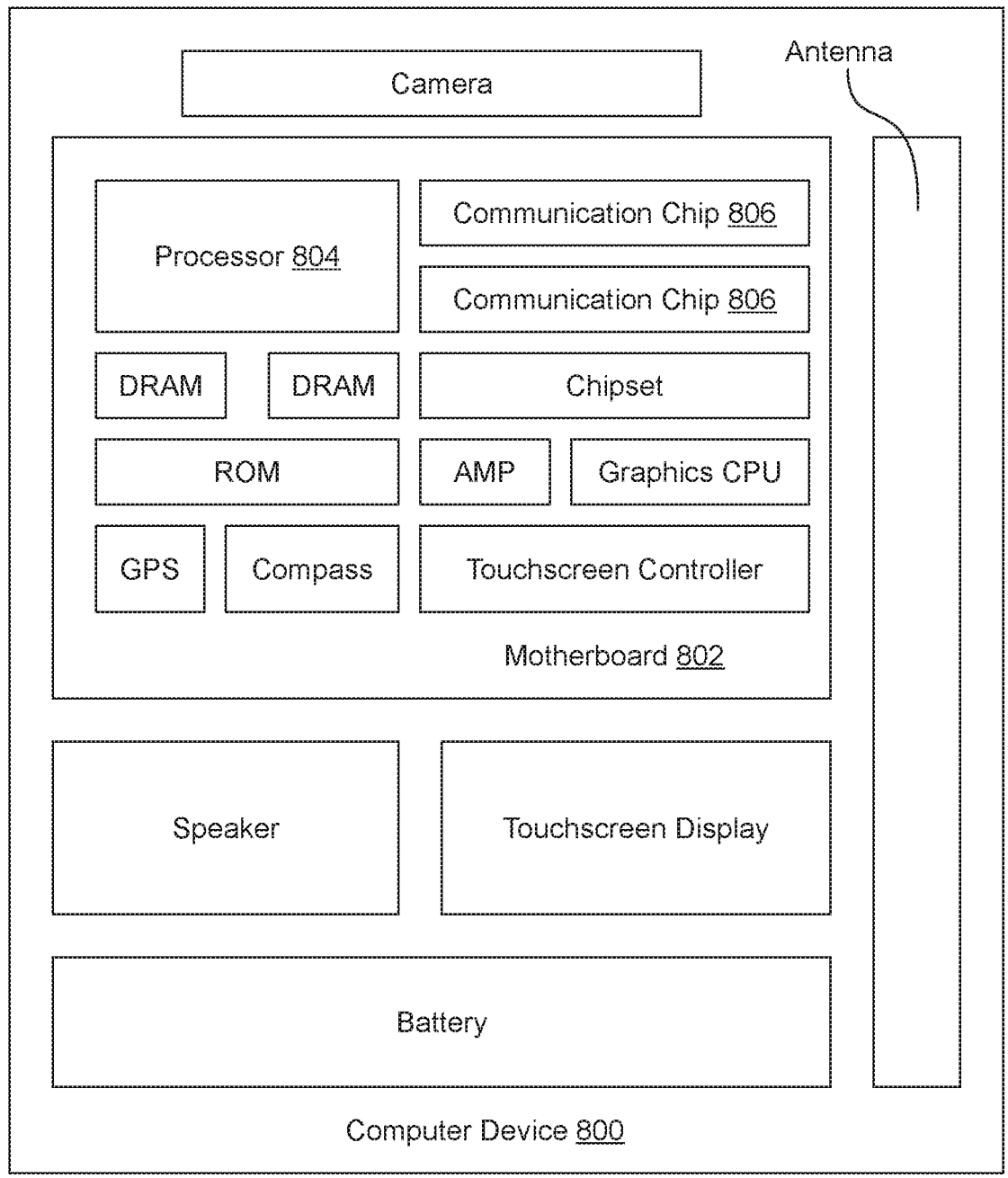
FIG. 8 is a functional block diagram illustrating a computing device in accordance with one embodiment.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The term "processor" may refer to any device or portion of a device that processes electronic data from registers and/or memory to transform that electronic data into other electronic data that may be stored in registers and/or memory. The communication chip 806 also includes an integrated circuit die packaged within the communication chip 806.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
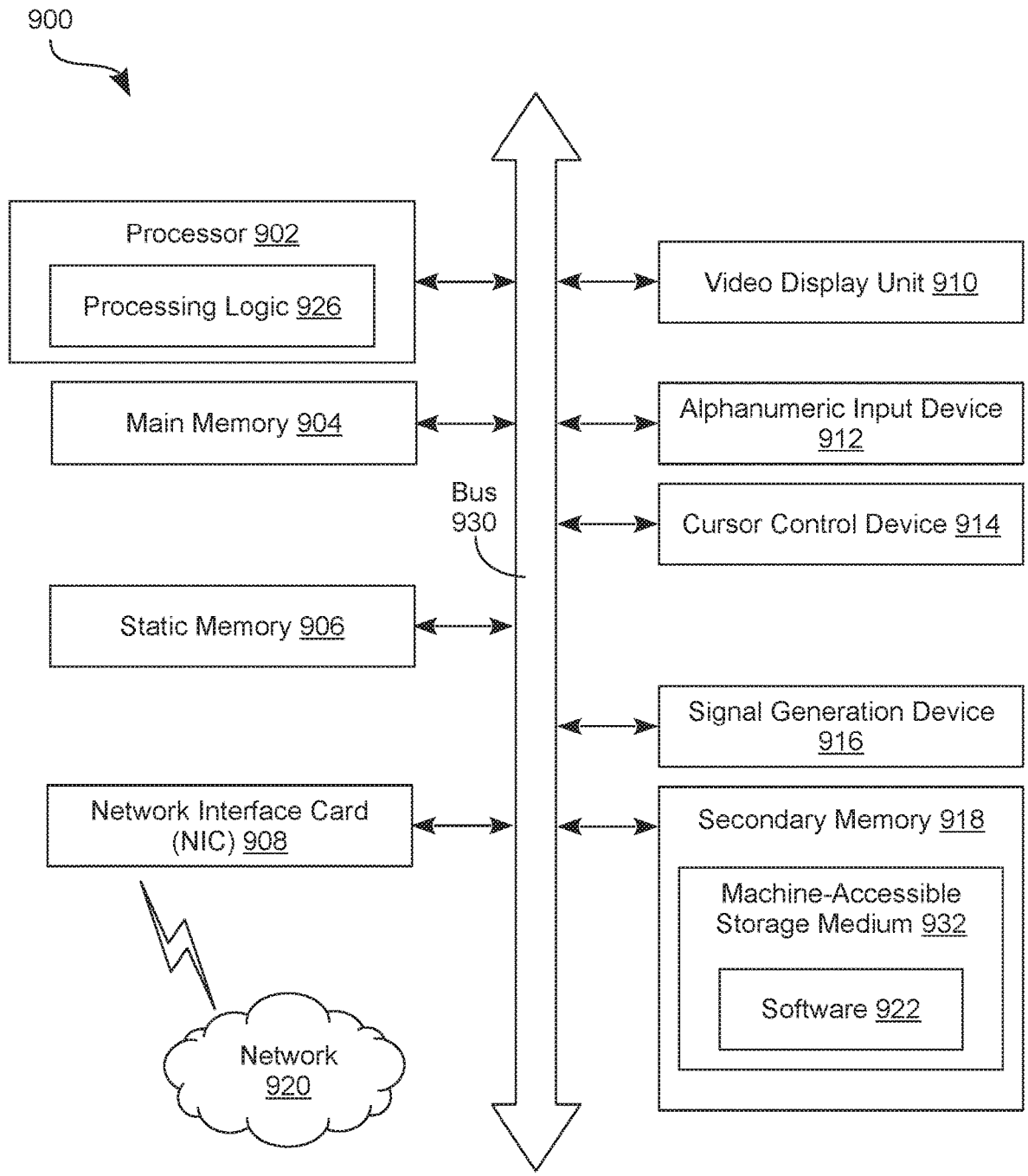
FIG. 9 is a functional block diagram illustrating an exemplary computer system, in accordance with one embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for facilitating data communication are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
    first conductive contacts to couple the device to a circuit board, wherein the first conductive contacts are to be coupled to communicate a first data signal with the circuit board, and further to receive a voltage and a control signal each from the circuit board;
    an amplifier circuit to receive the voltage and the control signal via the first conductive contacts, the amplifier circuit comprising:
        a variable resistor to provide a resistance based on the control signal; and
        an active circuit element coupled to the variable resistor, the active circuit element to conduct a current based on the voltage and the resistance; and
    a second conductive contact to couple the device to a hardware interface, wherein the second conductive contact is to communicate a second data signal with a connector via the hardware interface, wherein one of the first data signal or the second data signal is based on each of the current and the other of the first data signal or the second data signal.

2. The device of claim 1, wherein the amplifier circuit includes a common gate amplifier.

3. The device of claim 1, wherein the first conductive contacts and the second conductive contact are each on a first side of the device.

4. The device of claim 1, wherein the first conductive contacts are on a first side of the device, and the second conductive contact is on a second side of the device, wherein the second side is opposite the first side.

5. The device of claim 1, wherein the first conductive contacts to couple the device to the circuit board comprises the first conductive contacts to couple the device to a substrate of a dual in-line memory module.

6. The device of claim 1, wherein the first conductive contacts to couple the device to the circuit board comprises the first conductive contacts to couple the device to a motherboard.

7. The device of claim 1, wherein the first conductive contacts are to receive the first data signal or the control signal from a transmitter circuit of a second device, wherein the second device comprises a system-on-chip.

8. The device of claim 7, wherein the second conductive contact is to transmit the second data signal to a receiver circuit of a third device, wherein the third device comprises a dynamic random access memory.

9. The device of claim 1, further comprising one or more other amplifier circuits, wherein for each amplifier circuit of the one or more other amplifier circuits:
    the amplifier circuit comprises a respective variable resistor, and a respective active circuit element; and
    the amplifier circuit is to be coupled to receive from the circuit board a respective voltage, and a respective control signal, wherein the amplifier circuit is to provide a respective impedance matching based on the respective voltage and the respective control signal.

10. A system comprising:
    a circuit board;
    a packaged device coupled to the circuit board, the packaged device comprising:
        first conductive contacts coupled to communicate a first data signal with the circuit board, and to further receive a voltage and a control signal each from the circuit board;
        an amplifier circuit to receive the voltage and the control signal via the first conductive contacts, the amplifier circuit comprising:
            a variable resistor to provide a resistance based on the control signal; and
            an active circuit element coupled to the variable resistor, the active circuit element to conduct a current based on the voltage and the resistance; and
        a second conductive contact coupled to a hardware interface, wherein the second conductive contact is to communicate a second data signal with a connector via the hardware interface, wherein one of the first data signal or the second data signal is based on each of the current and the other of the first data signal or the second data signal; and
    a display device coupled to the packaged device, the display device to display an image based on one of the first data signal or the second data signal.

11. The system of claim 10, further comprising a second packaged device coupled to the circuit board, the second packaged device comprising:
    first circuitry to evaluate a characteristic of data communications which comprise the first data signal and the second data signal
    second circuitry coupled to the first circuitry, the second circuitry to detect an impedance mismatch based on the characteristic; and
    third circuitry, responsive to the second circuitry, to adjust one of the voltage or the control signal.

12. The system of claim 10, wherein the amplifier circuit includes a common gate amplifier.

13. The system of claim 10, wherein the first conductive contacts and the second conductive contact are each on a first side of the packaged device.

14. The system of claim 10, wherein the circuit board comprises a motherboard.

15. The system of claim 10, wherein the device further comprises one or more other amplifier circuits, wherein for each amplifier circuit of the one or more other amplifier circuits:
    the amplifier circuit comprises a respective variable resistor, and a respective active circuit element; and
    the amplifier circuit is coupled to receive from the circuit board a respective voltage, and a respective control signal, wherein the amplifier circuit is to provide a respective impedance matching based on the respective voltage and the respective control signal.

16. An integrated circuit (IC) comprising:
    first circuitry to evaluate a characteristic of data communications which comprise:
        a first communication of a first data signal between a device and a circuit board coupled to the device; and a second communication of a second data signal between the device and a connector;

second circuitry coupled to the first circuitry, the second circuitry to detect an impedance mismatch based on the characteristic; and third circuitry, responsive to the second circuitry, to adjust one of a voltage or a control signal each to be provided to an amplifier circuit of the device via the circuit board, wherein a variable resistor of the amplifier circuit provides a resistance based on the control signal, wherein an active circuit element of the amplifier circuit conducts a current based on the voltage and the resistance, and wherein one of the first data signal or the second data signal is generated based on each of the current, and the other of the first data signal or the second data signal.

17. The IC of claim 16, further comprising circuitry to transmit or receive the first data signal, wherein the first data signal and the second data signal are compatible with a dual data rate memory specification.

18. The IC of claim 16, wherein a system-on-chip comprises the IC.

19. The IC of claim 16, wherein the device further comprises one or more other amplifier circuits and wherein, for each of the one or more other amplifier circuits:

the third circuitry is to further configure a respective impedance matching by the other amplifier circuit, including the third circuitry to adjust one of a respective voltage and a respective control signal provided to the other amplifier circuit.

20. The IC of claim 16, wherein the IC is configured to couple to the device via a motherboard.

* * * * *